United States Patent [19]

Yonemoto

[11] Patent Number: 5,298,778
[45] Date of Patent: Mar. 29, 1994

[54] SOLID STATE IMAGE PICKUP DEVICE

[75] Inventor: Kazuya Yonemoto, Tokyo, Japan

[73] Assignee: Sony Corporation, Tokyo, Japan

[21] Appl. No.: 53,443

[22] Filed: Apr. 28, 1993

[30] Foreign Application Priority Data

May 15, 1992 [JP] Japan .................................. 4-148595

[51] Int. Cl.⁵ ...................... H01L 29/80; H01L 27/14
[52] U.S. Cl. ..................................... 257/257; 257/258; 257/261; 257/263; 257/265; 257/443; 257/445
[58] Field of Search ............... 257/257, 258, 261, 263, 257/265, 266, 270, 272, 287, 443, 445

[56] References Cited

U.S. PATENT DOCUMENTS

| | | | |
|---|---|---|---|
| 3,964,083 | 6/1976 | Lohstroh | 257/258 |
| 4,216,490 | 8/1980 | Ohki | 257/261 |
| 4,641,167 | 2/1987 | Nishizawa | 257/257 |
| 4,651,180 | 3/1987 | Nishizawa et al. | 257/257 |

Primary Examiner—Mark V. Prenty
Attorney, Agent, or Firm—William S. Frommer; Alvin Sinderbrand

[57] ABSTRACT

An application-type solid state imaging device which includes a plurality of picture elements arranged in a two-dimensional matrix. A sensor region is surrounded by a substrate and a gate region is positioned laterally substantially about the sensor region. A source region is formed through one surface of the substrate and aligned vertically with the sensor region, while a drain is formed at an opposing surface of the substrate and is likewise aligned with the sensor region. The sensor region and the gate region together define a channel through which source-drain current flows. Light incident on the substrate passes therethrough to the sensor region where charge accumulates photoelectrically for producing an image signal by controlling the source-drain current in proportion to the magnitude of the photoelectrically accumulated charge. The device is reset after reading by removing charge accumulated in the sensor region through the gate region.

10 Claims, 5 Drawing Sheets

SOLID STATE IMAGE PICKUP DEVICE

BACKGROUND OF THE INVENTION

The present invention relates to amplification-type solid state image pickup devices, and methods of using the same.

Amplification-type solid state image pickup devices employ picture elements which serve both to amplify a detected light signal and to output the amplified signal when scanned in accordance with a predetermined scanning sequence. Such image pickup devices include charge modulation devices (CMD) in the form of MOS-FET devices in which photoelectric charge is accumulated in the MOS gate.

The MOS-FET devices employ a polysilicon gate electrode disposed over a light-receiving region of the device. Consequently, the light is attenuated by the polysilicon gate electrode before it is able to reach the light-receiving region in order to be detected. A further drawback of the device is that short wavelength visible light is attenuated more severely so that the sensitivity of the device to blue light is considerably less than its sensitivity to longer wavelengths.

Although efforts have been made to minimize the thickness of the gate electrodes used in MOS-FET devices, the ability to reduce their thickness is limited, so that some light attenuation thereby inevitably occurs. Moreover, the gate electrode cannot be made substantially transparent, so that a considerable degree of light attenuation results as light passes through the gate electrode, resulting in the aforementioned reduced sensitivity.

OBJECTS AND SUMMARY OF THE INVENTION

It is an object of the present invention to overcome or alleviate the foregoing shortcomings and disadvantages of known imaging devices.

It is another object of the present invention to provide amplification-type solid state image pickup devices in which incident light attenuation is minimized.

It is a further object of the present invention to provide such image pickup devices which provide improved light sensitivity.

It is still another object of the present invention to provide such an image pickup device providing improved sensitivity to short wavelength visible light.

It is yet another object of the present invention to provide methods for reading and resetting amplification-type solid state image pickup devices which advantageously minimize residual image effects.

In accordance with a first aspect of the present invention, an amplification-type solid state imaging device including a plurality of picture elements arranged in a two-dimensional matrix is provided wherein each of the plurality of picture elements comprises a semiconductor substrate of a first conductivity type having an upper surface and a lower surface; a sensor region of a second conductivity type surrounded by the substrate; a source region of the first conductivity type extending downwardly from the upper surface of the substrate and positioned above the sensor region; a drain positioned below the sensor region; and a gate region of the second conductivity type extending downwardly from the upper surface of the substrate and positioned laterally substantially about the source region and the sensor region, the gate region and the sensor region defining a channel region therebetween. Accordingly, there is no need to provide a gate electrode interposed between the sensor region and the incident light to be sensed, so that light attenuation, especially at shorter visible wavelengths, is minimized thus to advantageously improve the sensitivity which may be achieved.

In accordance with a further aspect of the present invention, a method of reading a picture element of an amplification-type solid state imaging device including a plurality of picture elements arranged in a two-dimensional matrix is provided. The picture element includes a semiconductor substrate of a first conductivity type having an upper surface and a lower surface, a sensor region of a second conductivity type surrounded by the substrate, a source region of the first conductivity type extending downwardly from the upper surface of the substrate and positioned above the sensor region, a drain positioned below the sensor region, and a gate region of the second conductivity type extending downwardly from the upper surface of the substrate and positioned laterally substantially about the source region and the sensor region, the gate region and the sensor region defining a channel region therebetween. The method comprises the steps of: exposing the sensor region to light such that photoelectrically produced charge accumulates therein; causing a source-drain current to flow through the channel region; sensing the source-drain current to produce an output signal representing an amount of light received by the sensor region; and resetting the picture element by removing charge accumulated in the sensor region through the gate region. The method in accordance with this aspect of the present invention advantageously minimizes residual image effects encountered in known devices.

The above, and other objects, features and advantageous of the invention, will be apparent in the following detailed description of certain illustrative embodiments thereof which is to read in connection with the accompanying drawings forming a part hereof, and wherein corresponding parts and components are identified by the same reference numerals in the several views of the drawings.

As used herein, expressions such as "downwardly," "upwardly," "upper," "lower," "above," "below," "horizontal" and "vertical," when referring to elements of the devices and methods disclosed and/or claimed herein are used in this application to express relative positions and directions, rather than positions and directions with respect to a fixed reference. It is intended that these terms should be broadly construed. Their use herein is for convenience and to promote a clear understanding of the present invention.

BRIEF DESCRIPTION OF THE DRAWINGS

The following detailed description, given by way of example, and not intended to limit the present invention solely thereto, will best be understood in conjunction with the accompanying drawings in which.

DETAILED DESCRIPTION OF AN ADVANTAGEOUS EMBODIMENT

Figure 1:
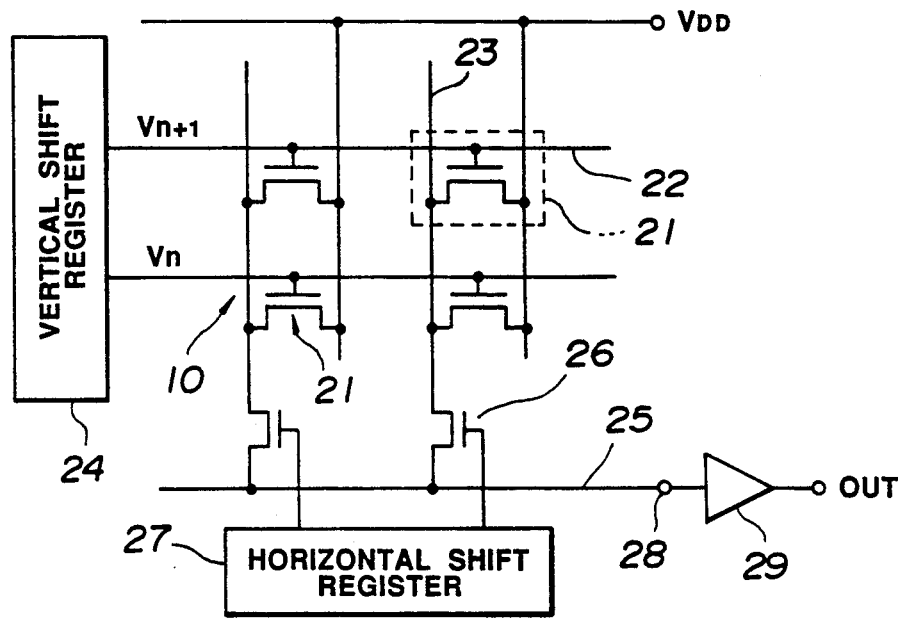
FIG. 1 schematically illustrates a two-dimensional array of picture elements of a JFET-type solid state image pickup device in accordance with an embodiment of the present invention, together with associated vertical and horizontal scanning circuitry and image signal readout circuitry.

Referring to the drawings in detail, and presently to FIG. 1 thereof, a junction field effect transistor (JFET)-type solid state image pickup device is illustrated schematically therein. An image sensor portion 10 of the device comprises a two-dimensional matrix of picture element transistors 21 arranged as 768 elements in each horizontal line or row and 492 elements in each vertical line or column which collectively produce an image signal which is output in the form of a television signal as discussed in greater detail hereinbelow.

Each of the picture element transistors 21 includes a source, drain and gate. The gate of each picture element transistors 21 is connected to a vertical selecting line 22 in common with the gates of each of the remaining picture element transistors 21 of the same horizontal line. The drain of each picture element transistor 21 is connected to an electric power source voltage $V_{DD}$ and the source of each transistor 21 is connected to a vertical signal line 23 of the corresponding column, such that the source of each transistor 21 in a respective column is connected with the source of every other transistor 21 in the same column through its corresponding vertical signal line 23.

Each of the vertical selecting lines ( ..., $V_n$, $V_{n+1}$, ...) 22 is connected with a respective output of a vertical shift register 24 which is operative to shift a high voltage level $\phi H$ in sequence from the lowermost one of the vertical selecting lines 22 to the uppermost one thereof of the image sensor portion 10 in sync with the horizontal interval of a television signal. All of the vertical selecting lines 22 other than the vertical selecting line to which the high voltage $\phi H$ is applied during a given horizontal interval is supplied with an intermediate voltage $\phi M$. The high voltage $\phi H$ is selected at a level which will cause a source-drain current to flow in the picture element transistors 21 of the selected horizontal line when a source-drain voltage is applied thereto. The intermediate voltage $\phi M$ is selected at a level such that current will be inhibited from flowing in the picture element transistors to which the intermediate voltage is applied.

Each of the vertical signal lines 23 is coupled with one terminal of the source-drain circuit of a respective horizontal switch transistor 26. Second terminals of each of the horizontal switch transistors coupled with the source-drain circuit thereof are connected in common to a horizontal signal line 25. The gates of the horizontal switch transistors 26 are each coupled with a respective output of a horizontal shift register 27 Which is operative to supply a horizontal scanning voltage to the gates of the horizontal switch transistors 26 in order to turn on the switches in sequence from left to right as viewed in FIG. 1. Accordingly, at any given time only one of the picture element transistors 21 is selected due to the combined actions of the vertical shift register 24 and the horizontal shift register 27, such that the picture element transistors 21 are scanned in an order so that at first each of the transistors in a lowermost horizontal line of the image sensor portion 10 is selected sequentially from left to right as viewed in FIG. 1, and in succession thereafter each transistor 21 in the next higher horizontal line is likewise scanned in sequence from left to right. As each transistor 21 is thus selected, current flows through the source-drain circuit thereof through the respective horizontal switch transistor 26 to the input of a current detection amplifier 29 via an output terminal 28 of the horizontal signal line 25. In this fashion, an image signal synchronized with the horizontal and vertical sync signals of a television signal is thus produced.

Figure 2:
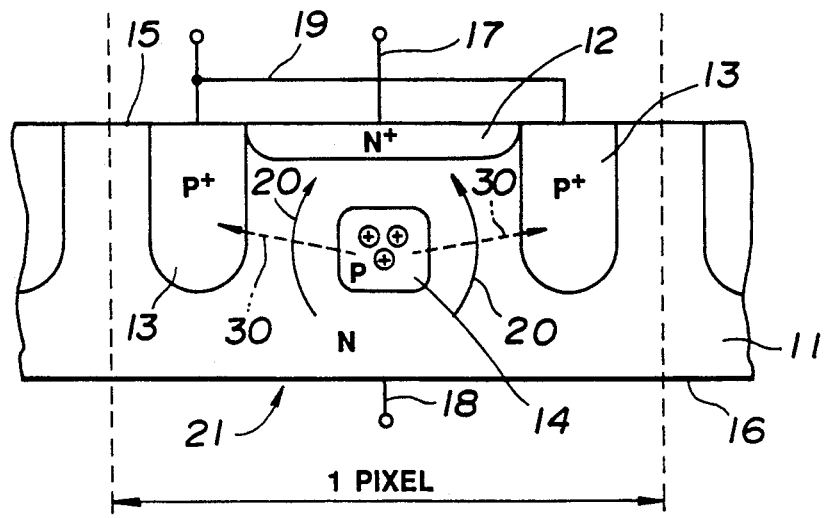
FIG. 2 is a partially cross-sectional and partially schematic illustration of a picture element in accordance with the embodiment of FIG. 1.

Referring now to FIG. 2, a partially cross-sectional and partially schematic illustration of a picture element transistor 21 constituting a single picture element (pixel) in the image sensor portion 10 of the JFET-type solid state image pickup device of FIG. 1, is provided thereby.

Figure 3:
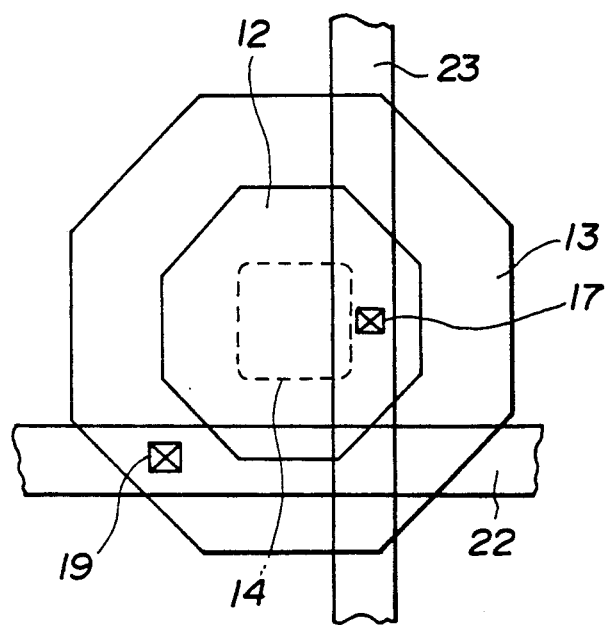
FIG. 3 is a diagrammatic view of an upper surface of a picture element in accordance with the embodiment of FIG. 1.

In the illustration of FIG. 2, an N-type substrate 11 is illustrated in cross-sectional form, the substrate 11 having an upper surface 15 and a lower surface 16 opposite the surface 15. An N+-type source region 12 extends from upper surface 15 downwardly into the substrate to a relatively shallow extent. A P+-type gate region 13 extends from upper surface 15 of substrate 11 downwardly toward the lower surface 16 to a relatively deeper extent than the source region 12 and is laterally positioned about the source region 12. Referring also to FIG. 3, which is a diagrammatic view looking down on the upper surface of the device of FIG. 2, the gate region 13 in the disclosed embodiment possesses a generally hexagonal cross section when viewed in a plane parallel with the surface 15. In alternative embodiments, the gate region 13 can possess a circular, rectangular or other type of cross-sectional configuration, as well.

In addition, a P-type sensor region 14 is formed within the substrate 11 so that it is surrounded by the same and is positioned beneath the source region 12. Moreover, the sensor region 14 is positioned so that the gate region 13 is positioned laterally about the sensor region 14. In certain embodiments, the gate region 13 need not extend laterally completely about the sensor region 14 and source region 12, but only substantially thereabout so that crosstalk between adjacent pixels is adequately suppressed.

As illustrated schematically in FIG. 2, and diagrammically in FIG. 3, a source electrode 17 is connected with the source region 12 and, as illustrated in FIG. 3, is likewise connected with the vertical signal line 23 corresponding with the column in which the respective transistor 21 is arranged. In addition, a drain electrode 18 is deposited on the lower surface 16 of the substrate 11 to form a drain thereat as illustrated schematically in FIG. 2. Finally, a gate electrode 19 is connected with the gate region 13, as illustrated schematically in FIG. 2 and diagrammatically in FIG. 3 and, as illustrated in FIG. 3, is also connected with a respective vertical selecting line 22 corresponding with the horizontal line or row in which the respective transistor 21 is arranged.

In operation, light to be sensed is transmitted through the upper surface 15 of the substrate 11 through the source region 12 to the sensor region 14, where it is absorbed and converted photoelectrically to holes within the region 14. Accordingly, the holes thus produced accumulate in an amount proportional to the intensity of the received light, such that the electric potential of the sensor region 14 likewise changes. The sensor region 14 and gate region 13 define a channel region of the substrate 11 therebetween through which channel current, indicated by arrows 20, may flow when an appropriate source-drain voltage is applied, and the high voltage level $\phi H$ is applied to the gate region 13. The channel current changes in proportion to the number of holes accumulated photoelectrically in the sensor region 14, which thus provides a signal representative of the intensity of the light received by the sensor region 14. The channel current which is thus controlled by the potential of the sensor region 14 in proportion to the number of holes therein is output via the respective vertical signal line when the transistor 21 is selected as described above and the corresponding horizontal switch transistor 26 to the current detection amplifier 29 of FIG. 1, thus to provide an output signal representing the intensity of light received by the selected transistor 21.

The structure of the transistor 21 as illustrated in FIG. 2 provides the ability to advantageously remove excessive numbers of photoelectrically generated holes in the sensor region 14 by permitting the same to overflow to the gate region 13 as a current conducted orthogonally to the direction of the flow of the channel current 20, as indicated by the dashed lines 30 in FIG. 2. In this manner, a blooming effect caused by a spreading of excessively produced photoelectric charge to adjacent pixels can be suppressed.

In addition, once the transistor has been read as described above, a residual image may be eliminated advantageously by a reset operation to remove the holes accumulated in the sensor region 14 through the gate region 13. More particularly, once the reading operation has been completed for a given picture element transistor 21, a low voltage level $\phi L$ is applied to the gate of the picture element transistor so that substantially all of the holes accumulated in the sensor region 14 are discharged to the gate region 13 by means of a punch-through effect. In this manner, the sensor region 14 is depleted of holes and a residual image may thus be effectively eliminated.

Figure 4:
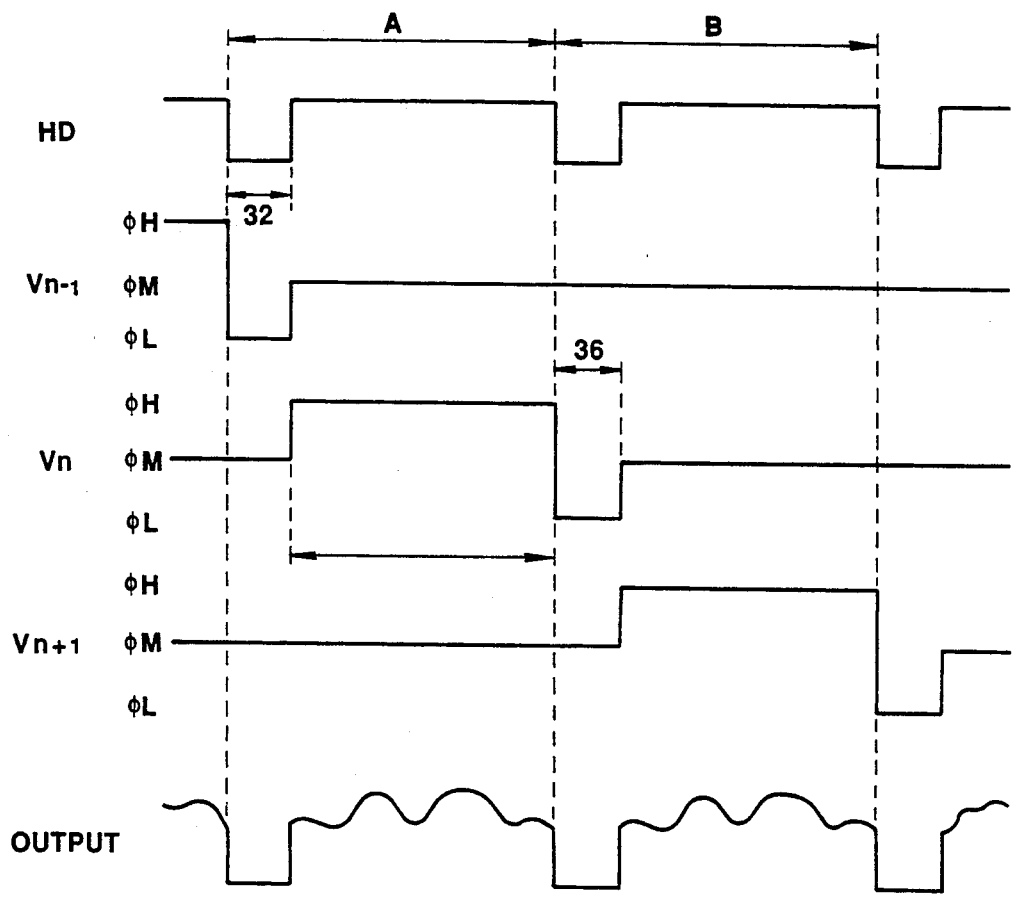
FIG. 4 is a timing chart illustrating a scanning sequence for reading and resetting the picture elements illustrated in FIG. 1.

With reference now to FIG. 4, a timing chart is provided therein for illustrating the sequence and manner in which the picture element transistors 21 are read and reset. More particularly, during a horizontal scanning period A, a horizontal line n is selected to be read. Accordingly, once a horizontal blanking period 32 of a horizontal sync signal HD has timed out, the voltage $V_n$ applied to the gates of the transistors 21 of horizontal line n is increased from the intermediate level $\phi M$ to the high level $\phi H$ to permit the transistors 21 of the horizontal line n to be read in sequence from left to right as illustrated in FIG. 1 as scanned by the horizontal shift register 27. Once the horizontal scanning portion of the period A has expired, the level of the voltage $V_n$ is reduced to the level $\phi L$ during the horizontal blanking period 36 of the next subsequent horizontal scanning period B, so that substantially all of the charge accumulated in the sensor regions 14 of the transistors 21 within the horizontal line n are removed through their respective gate regions 13 thus to deplete their sensor regions of holes and to eliminate any residual image therein.

Once the horizontal blanking period 36 of the horizontal scanning period B has expired, the voltage $V_n$ is returned to the intermediate level $\phi M$ until the line n is once again selected.

Since the line n-1 was selected for reading during the horizontal scanning period immediately prior to the period A in which the line n was read, the transistors 21 of line n-1 were reset during the horizontal blanking period 32 of period A. Moreover, since the horizontal line n+1 is selected next after the line n, the gate voltage applied to the transistors 21 of line n+1 is increased at the end of the horizontal blanking interval 36 of period B from the intermediate level $\phi M$ to the high level $\phi H$ so that the transistors 21 of line n+1 may then be read sequentially for the remainder of the period B. once again, at the end of the period B and for the duration of the succeeding horizontal blanking period, the voltage $V_{n+1}$ is reduced to the level $\phi L$ to reset the transistors of the line n+1. As also illustrated in FIG. 4, an output signal is generated as a composite of the horizontal sync signals HD and the image signals produced in sequence by the transistors 21 of each respective horizontal line. In this fashion, an image signal representing a frame of the television signal is thus produced.

Figure 5A:
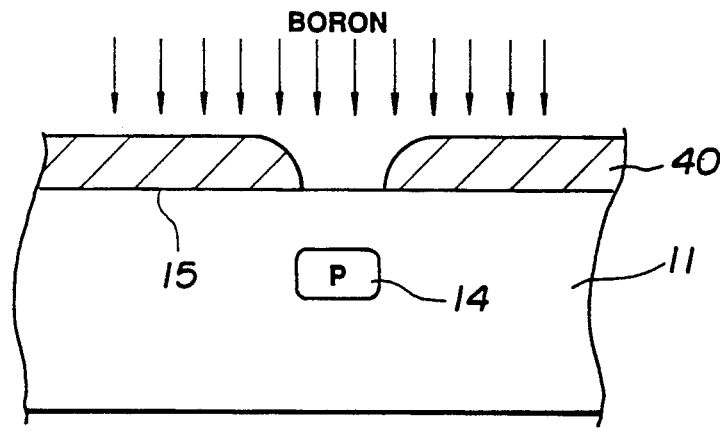
FIGS. 5A through 5E are diagrams for use in illustrating a method of fabricating a picture element of the FIG. 1 embodiment.
Figure 5B:
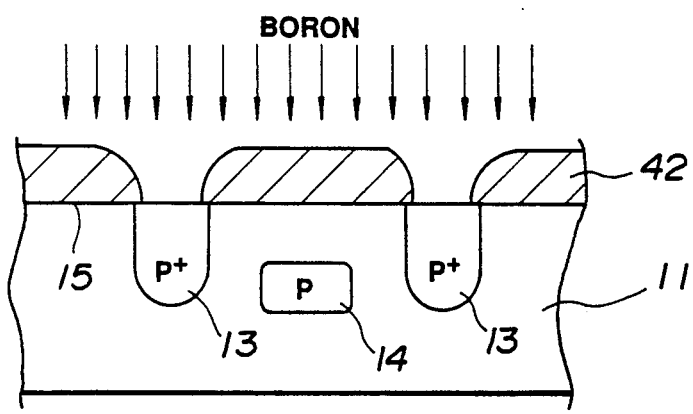

Referring now to FIGS. 5A through 5E, a method of fabricating a picture element transistor in accordance with the embodiment of FIG. 1 is illustrated therein. In a first step as illustrated in FIG. 5A, an ion implantation mask 40 is formed to define a portion of the upper surface 15 of the substrate 11 through which p-type boron impurities are implanted deeply with the substrate 11 by mega-electron volt implantation thus to form the sensor region 14 imbedded within the substrate 11.

Thereafter, as illustrated in 5B, the gate region 13 is formed. To do so, a further resist mask 42 is formed to define a further portion of the surface 15 through which P-type boron impurities are injected into the substrate 11 by ion implantation thus to form the P+ gate region 13. The depth of region 13 is achieved by an appropriately long implantation period or by annealing after implantation.

Figure 5C:
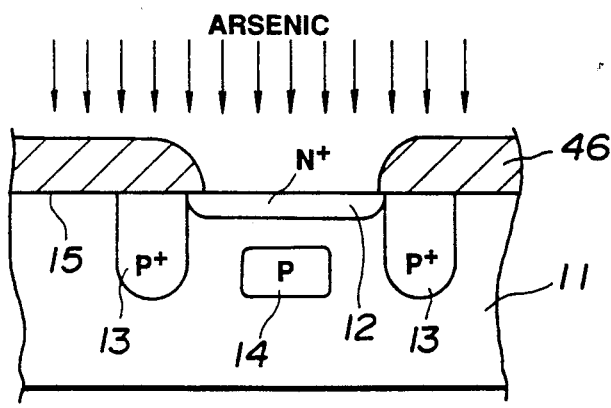
Figure 5D:
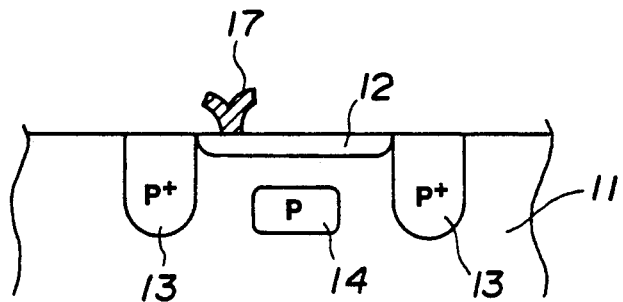
Figure 5E:
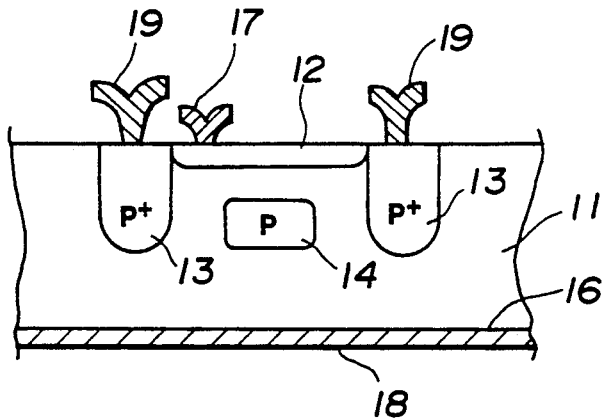

Thereafter, as shown in FIG. 5C, still another resist pattern 46 is formed on the surface 15 of the substrate 11 to define a portion of the surface through which the N+-type source region 12 is formed by implantation of arsenic ions. The depth of region 12 is selected by control of implantation time and/or annealing, as in the case of gate region 13. Subsequently, as illustrated in FIG. 5D, the source electrode 17 is formed by deposition of aluminum or by polysilicon growth. Finally, as illustrated in FIG. 5E, the gate electrode or electrodes 19 are formed in the same manner as the source electrode 17, while the drain electrode 18 is formed by vapor deposition of an aluminum layer on the lower surface 16 of the substrate 11.

It will be seen that, by arranging the gate region laterally of the sensor region, so that the channel for conducting source-drain current is disposed vertically in the structure of the picture element transistor, reduced attenuation of the incident light may be achieved, so that improved sensitivity may be realized especially in the case of short wavelength visible light. Moreover, an advantageous method for reading and resetting the solid state image pickup device of the present invention is provided in which charge accumulated in the sensor region of a picture element transistor through absorption of the light is effectively removed in its entirety thus to eliminate any residual image.

Although specific embodiments of the invention have been described in detail herein, it is to be understood that the invention is not limited to those precise embodiments, and that various changes and modifications may be effected therein by one skilled in the art without departing from the scope or spirit of the invention as defined in the appended claims.

What is claimed is:

1. An amplification-type solid state imaging device including a plurality of picture elements arranged in a two-dimensional matrix, each of the plurality of picture elements comprising:
 a semiconductor substrate of a first conductivity type having an upper surface and a lower surface;
 a sensor region of a second conductivity type surrounded by the substrate;
 a source region of the first conductivity type extending downwardly from the upper surface of the substrate and positioned above the sensor region;
 a drain positioned below the sensor region; and
 a gate region of the second conductivity type extending downwardly from the upper surface of the substrate and positioned laterally substantially about the source region and the sensor region, the gate region and the sensor region defining a channel region therebetween.

2. An amplification-type solid state imaging device according to claim 1, wherein the channel region comprises a portion of the substrate between the gate region and the sensor region.

3. An amplification-type solid state imaging device according to claim 1 rein the channel region is of the first conductivity type.

4. An amplification-type solid state imaging device according to claim 3, further comprising means for applying a voltage between the source region and the drain region such that a current flows from the drain region to the source region through the channel region.

5. An amplification-type solid state imaging device according to claim 4, wherein the sensor region is operative to accumulate a charge in response to light absorbed therein such that the channel current varies in proportion to the amount of charge accumulated in the sensor region.

6. An amplification-type solid state imaging device according to claim 4, wherein the sensor region is operative to accumulate a charge in response to light absorbed therein, the device further comprising reset means for applying a reset voltage to the gate region such that the charge accumulated in the sensor region is injected into the gate region in response to the reset voltage.

7. An amplification-type solid state imaging device according to claim 6, further comprising reading means coupled with the source-drain circuit of the device for reading a signal representing an amount of charge accumulated in the sensor region, the reset means being operative to apply the reset voltage after the reading means has read the signal.

8. An amplification-type solid state imaging device according to claim 1, further comprising means for removing charge accumulated in the sensor region above a predetermined level via overflow of charge to the gate region, the predetermined level being selected to prevent the occurrence of a blooming effect.

9. A method of reading a picture element of an amplification-type solid state imaging device including a plurality of picture elements arranged in a two-dimensional matrix, the picture element including a semiconductor substrate of a first conductivity type having an upper surface and a lower surface, a sensor region of a second conductivity type surrounded by the substrate, a source region of the first conductivity type extending downwardly from the upper surface of the substrate and positioned above the sensor region, a drain positioned below the sensor region, and a gate region of the second conductivity type extending downwardly from the upper surface of the substrate and positioned laterally substantially about the source region and the sensor region, the gate region and the sensor region defining a channel region therebetween, comprising the steps of:
 exposing the sensor region to light such that photoelectrically produced charge accumulates therein;
 causing a source-drain current to flow through the channel region;
 sensing the source-drain current to produce an output signal representing an amount of light received by the sensor region; and
 resetting the picture element by removing charge accumulated in the sensor region through the gate region.

10. The method of claim 9, wherein the step of resetting the picture element comprises applying a voltage level to the gate region such that charge accumulated in the sensor region is removed therefrom via the channel region to the gate region.

* * * * *